United States Patent
Carpentier et al.

(10) Patent No.: US 10,274,395 B2
(45) Date of Patent: Apr. 30, 2019

(54) SEMICONDUCTOR DEVICE AND WAFER WITH REFERENCE CIRCUIT AND RELATED METHODS

(71) Applicants: STMicroelectronics (Crolles 2) SAS, Crolles (FR); STMICROELECTRONICS SA, Montrouge (FR)

(72) Inventors: Jean-Francois Carpentier, Grenoble (FR); Patrick Le Maitre, Biviers (FR); Jean-Robert Manouvrier, Echirolles (FR); Charles Baudot, Lumbin (FR); Bertrand Borot, Le Cheylas (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/694,156

(22) Filed: Sep. 1, 2017

(65) Prior Publication Data

US 2017/0363507 A1 Dec. 21, 2017

Related U.S. Application Data

(63) Continuation of application No. 15/133,614, filed on Apr. 20, 2016, now Pat. No. 9,791,346.

(51) Int. Cl.
| | |
|---|---|
| *G01M 11/02* | (2006.01) |
| *G02B 6/28* | (2006.01) |
| *G02B 6/34* | (2006.01) |
| *G02B 6/12* | (2006.01) |
| *G01R 31/265* | (2006.01) |

(Continued)

(52) U.S. Cl.
CPC ............ *G01M 11/02* (2013.01); *G01M 11/33* (2013.01); *G01R 31/2656* (2013.01); *G01R 31/27* (2013.01); *G01R 31/2884* (2013.01); *G01R 31/303* (2013.01); *G01R 31/311* (2013.01); *G01R 31/31728* (2013.01); *G01R 35/00* (2013.01); *G02B 6/00* (2013.01);
(Continued)

(58) Field of Classification Search
CPC . G01M 11/02; G02B 6/12004; G02B 6/2808; G02B 6/34
See application file for complete search history.

(56) References Cited

U.S. PATENT DOCUMENTS

| | | | |
|---|---|---|---|
| 5,896,193 A | 4/1999 | Colbourne et al. | |
| 6,943,891 B2 * | 9/2005 | VanWiggeren | G01M 11/331 356/477 |

(Continued)

FOREIGN PATENT DOCUMENTS

| | | |
|---|---|---|
| CA | 2417790 A1 | 8/2003 |
| CN | 203116945 U | 8/2013 |

*Primary Examiner* — Michael P Stafira
(74) *Attorney, Agent, or Firm* — Slater Matsil, LLP

(57) ABSTRACT

A semiconductor device may include a semiconductor wafer, and a reference circuit carried by the semiconductor wafer. The reference circuit may include optical DUTs, a first set of photodetectors coupled to outputs of the optical DUTs, an optical splitter coupled to inputs of the optical DUTs, and a second set of photodetectors coupled to the optical splitter. The optical splitter is to be coupled to an optical source and configured to transmit a reference optical signal to the first set of photodetectors via the optical DUTs and the second set of photodetectors.

20 Claims, 6 Drawing Sheets

(51) Int. Cl.
  *G01R 31/27*  (2006.01)
  *G01R 31/28*  (2006.01)
  *G01R 31/303*  (2006.01)
  *G01R 31/311*  (2006.01)
  *G01R 31/317*  (2006.01)
  *G01R 35/00*  (2006.01)
  *G02B 6/00*  (2006.01)
  *G01M 11/00*  (2006.01)

(52) U.S. Cl.
  CPC ....... *G02B 6/12004* (2013.01); *G02B 6/2808* (2013.01); *G02B 6/34* (2013.01)

(56) References Cited

U.S. PATENT DOCUMENTS

| | | | |
|---|---|---|---|
| 6,970,237 B1 | 11/2005 | Stolle | |
| 6,985,648 B2 | 1/2006 | Kish, Jr. et al. | |
| 7,006,719 B2 | 2/2006 | Joyner et al. | |
| 7,012,440 B2 | 3/2006 | Feng | |
| 7,043,109 B2 | 5/2006 | Kish, Jr. et al. | |
| 7,129,100 B2 | 10/2006 | Joyner et al. | |
| 7,236,682 B2 | 6/2007 | Lalonde | |
| 7,529,436 B2 | 5/2009 | Joyner et al. | |
| 7,792,396 B2 | 9/2010 | Kish, Jr. et al. | |
| 8,786,843 B2 | 7/2014 | Chen | |
| 9,086,387 B2 | 7/2015 | Assefa et al. | |
| 9,453,723 B1 | 9/2016 | LeMaitre et al. | |
| 2003/0184734 A1 | 10/2003 | Parente et al. | |
| 2005/0030522 A1* | 2/2005 | Baney | G01M 11/331 356/72 |
| 2005/0030544 A1* | 2/2005 | VanWiggeren | G01M 11/31 356/450 |
| 2005/0062978 A1 | 3/2005 | Krause et al. | |
| 2005/0078315 A1* | 4/2005 | Ozeki | G01M 11/331 356/450 |
| 2011/0273719 A1* | 11/2011 | Froggatt | G01M 11/35 356/446 |
| 2013/0046499 A1 | 2/2013 | Minneman et al. | |
| 2014/0336973 A1 | 11/2014 | Froggatt et al. | |
| 2016/0146873 A1 | 5/2016 | Su et al. | |
| 2016/0266005 A1 | 9/2016 | Bos | |
| 2017/0307687 A1* | 10/2017 | Grosse | G01R 31/31728 |

\* cited by examiner

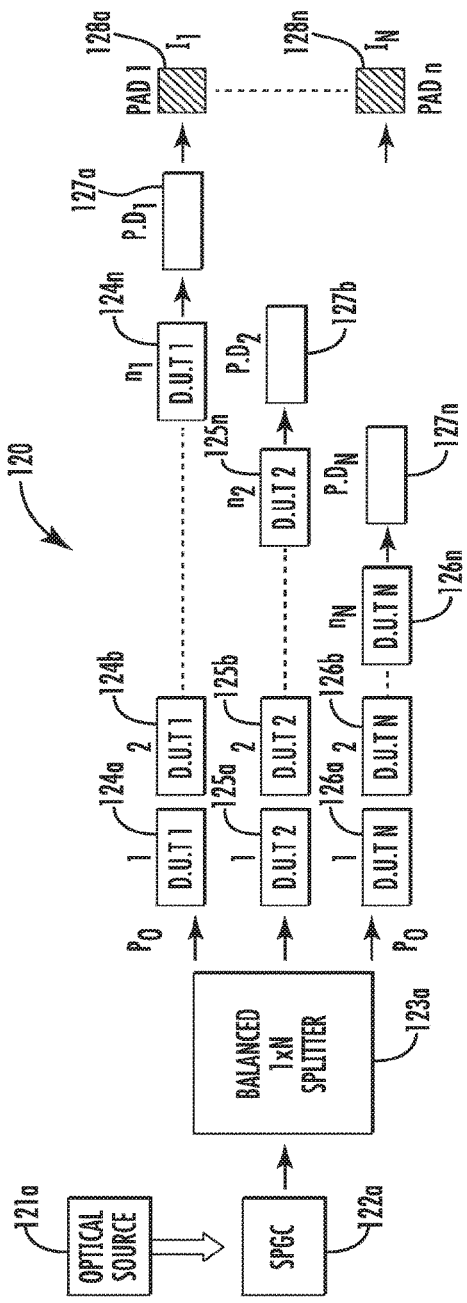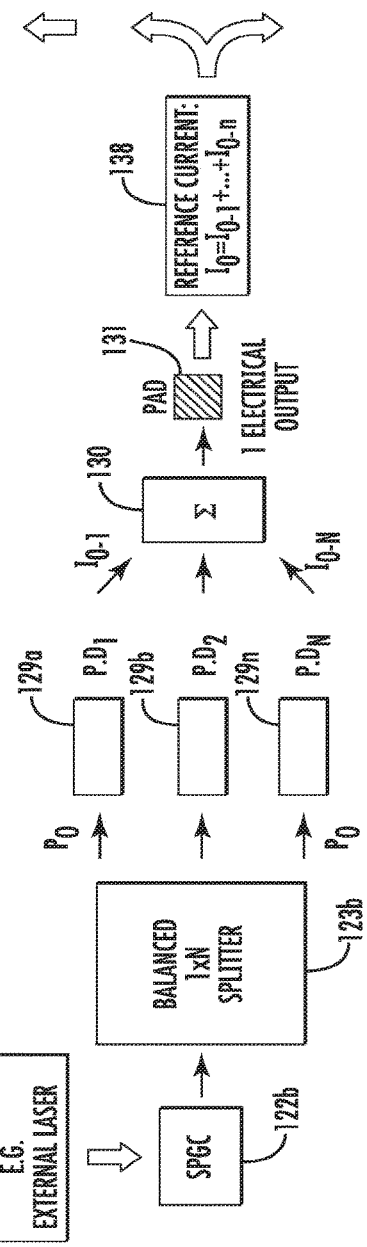
FIG. 4
FIG. 5

SEMICONDUCTOR DEVICE AND WAFER WITH REFERENCE CIRCUIT AND RELATED METHODS

CROSS-REFERENCE TO RELATED APPLICATIONS

This application is a continuation of U.S. patent application Ser. No. 15/133,614, filed on Apr. 20, 2016, and entitled "Semiconductor Device and Wafer with Reference Circuit and Related Methods," which application is hereby incorporated herein by reference.

TECHNICAL FIELD

The present disclosure relates to the field of photonics, and, more particularly, to an electro-optic device and related methods.

BACKGROUND

Integrated optical devices (i.e. photonic chip) for directly processing optical signals have become of greater importance as optical fiber communications increasingly replace metallic cable and microwave transmission links. Integrated optical devices can advantageously be implemented as silicon optical circuits having compact dimensions at relatively low cost. Silicon optical circuits employ integrated waveguide structures formed in a silicon layer of silicon-on-insulator (SOI) substrates, forming a silicon photonic chip.

In some applications, the optical signal is injected in/extracted from the photonic chip in a near perpendicular fashion, with respect to the photonic chip substrate plane, by way of grating couplers formed in the silicon photonic chip for input-output of the photonic signal. When using the silicon substrate in such a coupling fashion, such as when coupling to an optical fiber, the optical fiber is mounted in near perpendicular fashion.

During manufacture of integrated optical devices, a large number of integrated optical devices are fabricated on a typical semiconductor wafer. As part of a rigorous manufacturing process, it may be helpful to measure optical loss for quality control at the wafer level. Since optical loss in individual optical components is relatively low, testing for loss is typically performed on a special purposed test structure (i.e. the test structure will not be functional for the customer) comprising a plurality of optical components daisy chained together. During testing, a known/reference optical input is injected into the test structure and the optical output is measured, and compared with the known/reference optical input. One potential issue with testing individual devices at the wafer level is that optical inputs and outputs must be precisely aligned to accurately measure device loss. This may cause the testing process to be quite long and difficult.

SUMMARY

Generally speaking, a semiconductor device may include a semiconductor wafer, and at least one reference circuit carried by the semiconductor wafer. The at least one reference circuit may include a plurality of optical devices under tests (DUTs), a first set of photodetectors coupled to outputs of the plurality of optical DUTs, at least one optical splitter coupled to inputs of the plurality of optical DUTs, and a second set of photodetectors coupled to the at least one optical splitter. The at least one optical splitter is to be coupled to an optical source and configured to transmit a reference optical signal to the first set of photodetectors via the plurality of optical DUTs and the second set of photodetectors. Advantageously, the at least one reference circuit may be readily tested for determining optical loss.

In some embodiments, the at least one optical splitter may comprise first and second optical splitters. The first optical splitter may be coupled to the inputs of the plurality of optical DUTs, and the second optical splitter may be coupled to inputs of the second set of photodetectors. In other embodiments, the at least one optical splitter may comprise a single optical splitter.

Also, the at least one reference circuit may comprise a first plurality of output terminals respectively coupled to the first set of photodetectors. In other embodiments, the at least one reference circuit may comprise a summer circuit configured to sum outputs of the second set of photodetectors.

The at least one reference circuit may comprise a second plurality of output terminals respectively coupled to outputs of the second set of photodetectors. The first set of photodetectors may be spaced apart from the second set of photodetectors. The at least one optical splitter may comprise a balanced optical splitter, for example. The at least one reference circuit may comprise a grating coupler coupled to an input of the at least one optical splitter.

The semiconductor device may also comprise a plurality of integrated circuits (ICs) carried by the semiconductor wafer, and a plurality of scribe lines therebetween. The at least one reference circuit may be carried within the plurality of scribe lines.

Another aspect is directed to a semiconductor wafer comprising a semiconductor wafer device, and at least one reference circuit carried by the semiconductor wafer device. The at least one reference circuit may include a plurality of optical DUTs, a first set of photodetectors coupled to outputs of the plurality of optical DUTs, at least one optical splitter coupled to inputs of the plurality of optical DUTs, and a second set of photodetectors coupled to the at least one optical splitter. The at least one optical splitter may be coupled to an optical source and configured to transmit a reference optical signal to the first set of photodetectors via the plurality of optical DUTs and the second set of photodetectors.

Another aspect is directed to a method for testing a semiconductor device comprising at least one reference circuit. The at least one reference circuit may comprise a plurality of optical DUTs, a first set of photodetectors coupled to outputs of the plurality of optical DUTs, at least one optical splitter coupled to inputs of the plurality of optical DUTs, and a second set of photodetectors coupled to the at least one optical splitter. The method may include coupling the at least one optical splitter to an optical source for transmitting a reference optical signal to the first set of photodetectors via the plurality of optical DUTs and the second set of photodetectors, and determining an optical loss of the plurality of optical DUTs based upon a difference in electrical output between the first and second sets of photodetectors.

Yet another aspect is directed to a method for making a semiconductor device comprising forming at least one reference circuit carried by a semiconductor wafer, and forming the at least one reference circuit. The at least one reference circuit may include a plurality of optical DUTs, a first set of photodetectors coupled to outputs of the plurality of optical DUTs, at least one optical splitter coupled to inputs of the plurality of optical DUTs, and a second set of photodetectors coupled to the at least one optical splitter.

The at least one optical splitter may be coupled to an optical source and configured to transmit a reference optical signal to the first set of photodetectors via the plurality of optical DUTs and the second set of photodetectors.

BRIEF DESCRIPTION OF THE DRAWINGS

FIGS. 4-5 are schematic diagrams of portions of another embodiment of the reference circuit, according to the present disclosure.

DETAILED DESCRIPTION OF ILLUSTRATIVE EMBODIMENTS

Figure 1:
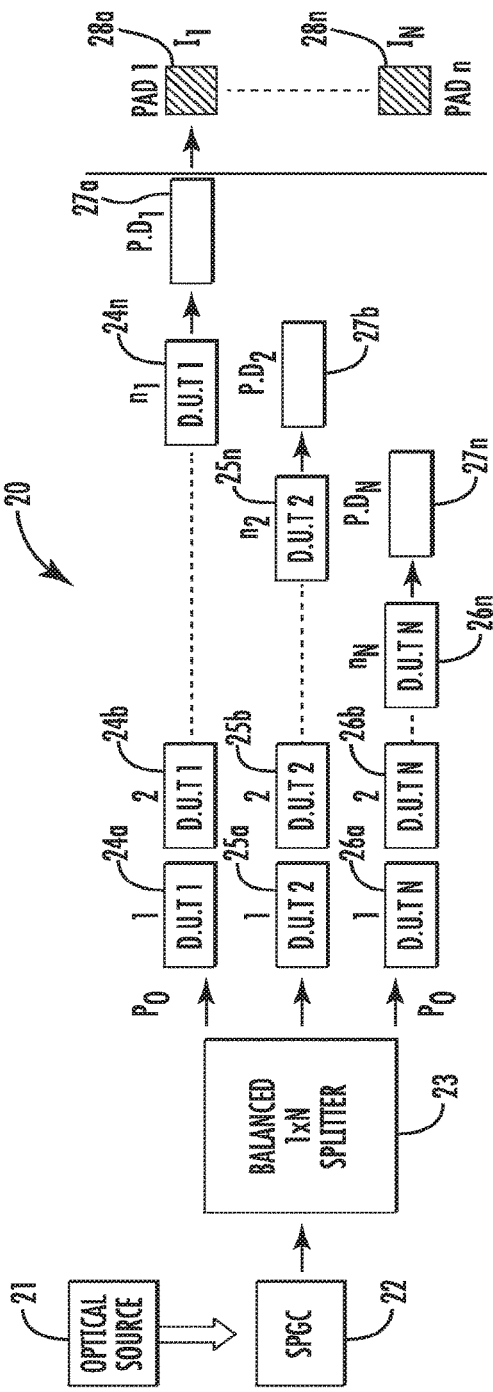
FIGS. 1-2 are schematic diagrams of portions of a reference circuit, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Figure 2:
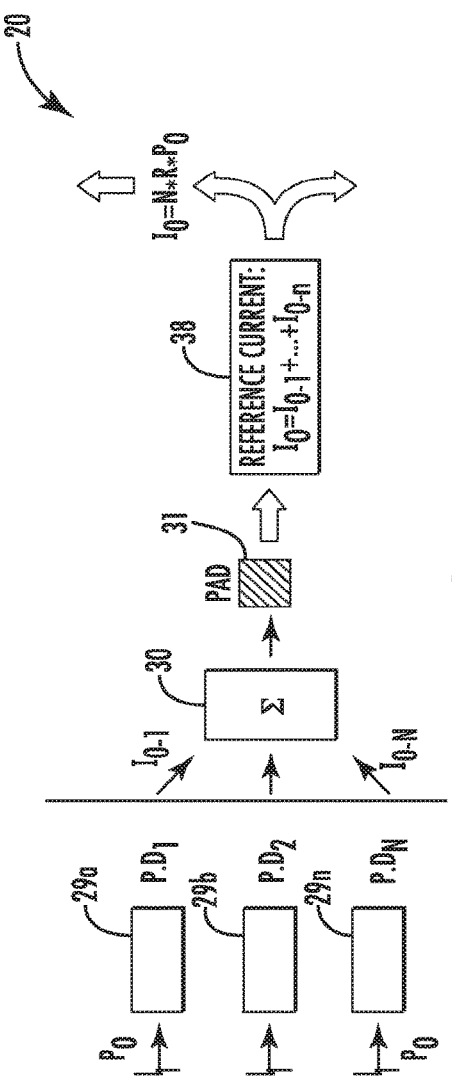
Figure 3:
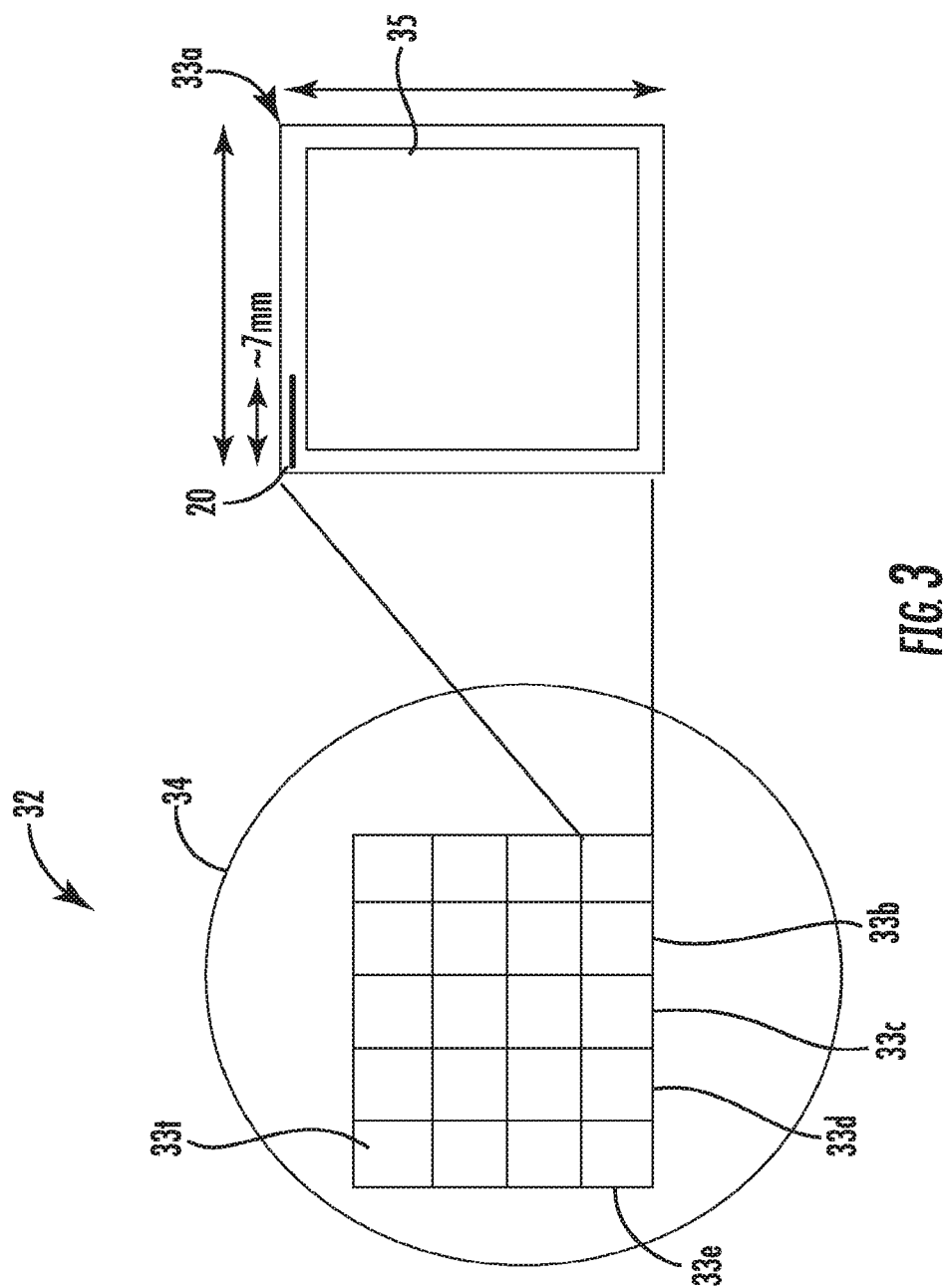
FIG. 3 is a semiconductor wafer, according to the present disclosure.

Referring initially to FIGS. 1-3, a semiconductor device 32 according to the present disclosure is now described. The semiconductor device 32 illustratively includes a semiconductor wafer (e.g. a 300 mm silicon wafer or SOI wafer) 34, and a reference circuit (or testing circuit) 20 carried by the semiconductor wafer. The semiconductor device 32 illustratively includes a plurality of ICs 33a-33t carried by the semiconductor wafer 34, and a plurality of scribe lines therebetween. The reference circuit 20 is illustratively carried within the plurality of scribe lines. In this embodiment, the reference circuit 20 is removed/destroyed after singulation, but in other embodiments, the reference circuit may be located beyond the plurality of scribe lines, i.e. it may remain in the ICs 33a-33t after singulation. In some embodiments, the semiconductor wafer 34 can include one or more test ICs comprising the reference circuit 20.

In the illustrated embodiment, only one IC 33a illustratively includes the reference circuit 20. Each IC 33a-33t includes other circuitry 35, which represents functional circuitry for use after singulation, i.e. non-test circuitry. But in some embodiments, each and every IC 33a-33t includes a reference circuit 20, i.e. the semiconductor device 32 would include a plurality of reference circuits. In other embodiments, each and every IC 33a-33t includes a plurality of reference circuits 20, for example, at two reference circuits at opposing sides of a respective IC.

The reference circuit 20 illustratively includes a grating coupler (or optical grating coupler) 22 to be coupled to an optical source (e.g. a laser optical source) 21. The reference circuit 20 illustratively includes a plurality of optical DUTs 24a-24n, 25a-25n, 26a-26n. Each optical DUT 24a-24n, 25a-25n, 26a-26n may comprise, for example, an optical waveguide, or an optical modulator component, such as meandering optical waveguides. The plurality of optical DUTs 24a-24n, 25a-25n, 26a-26n illustratively includes N parallel channels of DUTs, and each parallel channel may comprise a respective device type. In other words, in the illustrative embodiment, there are N optical devices being tested.

The reference circuit 20 illustratively includes a single optical splitter (e.g. a balanced optical splitter) 23 coupled between inputs of the plurality of optical DUTs 24a-24n, 25a-25n, 26a-26n and the grating coupler 22. In the illustrated embodiment, the single optical splitter 23 comprises a 1×2N splitter, with the combination of 1×N balanced splitter+1×2 balanced splitter on each output, for example. The reference circuit 20 illustratively includes a first set of photodetectors (e.g. photodiodes) 27a-27n coupled to outputs of the plurality of optical DUTs 24a-24n, 25a-25n, 26a-26n, and a second set of photodetectors (e.g. photodiodes) 29a-29n coupled to other outputs of the single optical splitter 23. Also, the reference circuit 20 illustratively includes a first plurality of output terminals 28a-28n respectively coupled to the first set of photodetectors 27a-27n, providing an individual output for each channel (or each type of DUT) of the plurality of optical DUTs 24a-24n, 25a-25n, 26a-26n. The reference circuit 20 illustratively includes a summer circuit 30 configured to sum outputs of the second set of photodetectors 29a-29n, and a second output terminal 31 coupled to an output of the summer circuit. The first and second output terminals 28a-28n, 31 comprise electrically conductive material, for example, copper, aluminum.

In some embodiments, the first set of photodetectors 27a-27n may be spaced apart from the second set of photodetectors 29a-29n. In other embodiments, the first set of photodetectors 27a-27n may be adjacent to the second set of photodetectors 29a-29n. Also, in this embodiment, the first and second sets of photodetectors 27a-27n, 29a-29n have matched responsivity values. The matching requirement is obtained either by appropriate design/layout/process of photodetectors and/or by adjacent hypothesis.

The single optical splitter 23 is to be coupled to the optical source 21 and is configured to transmit a reference optical signal to the first set of photodetectors 27a-27n via the plurality of optical DUTs 24a-24n, 25a-25n, 26a-26n and the second set of photodetectors 29a-29n. Since the second set of photodetectors 29a-29n receives the reference optical signal directly from the single optical splitter 23, the electrical output from the second output terminal 31 provides a lossless basis or combined reference current (outside of the intrinsic loss from the second set of photodetectors and the single optical splitter) for measuring the performance of the plurality of optical DUTs 24a-24n, 25a-25n, 26a-26n. Helpfully, the reference circuit 20 may be readily tested for determining optical loss by deriving a difference in a reference current 38 at the second output terminal 31 and a sum of the first plurality of output terminals 28a-28n.

The reference current 38 is governed by the following equation: $I_o = N*R*P_o$; where N is the number of the optical device; where R is the matched responsivity value, and where $P_o$ is the balanced optical power level.

Another aspect is directed to a semiconductor wafer 32 comprising a semiconductor wafer device (e.g. an IC) 34, and at least one reference circuit 20 carried by the semiconductor wafer device. The at least one reference circuit 20 may include a plurality of optical DUTs 24a-24n, 25a-25n, 26a-26n, a first set of photodetectors 27a-27n coupled to outputs of the plurality of optical DUTs, at least one optical splitter 23 coupled to inputs of the plurality of optical DUTs, and a second set of photodetectors 29a-29n coupled to the at least one optical splitter. The at least one optical splitter 23 may be coupled to an optical source 21 and configured to transmit a reference optical signal to the first set of photodetectors 27a-27n via the plurality of optical DUTs 24a-24n, 25a-25n, 26a-26n and the second set of photodetectors 29a-29n.

Figure 9:
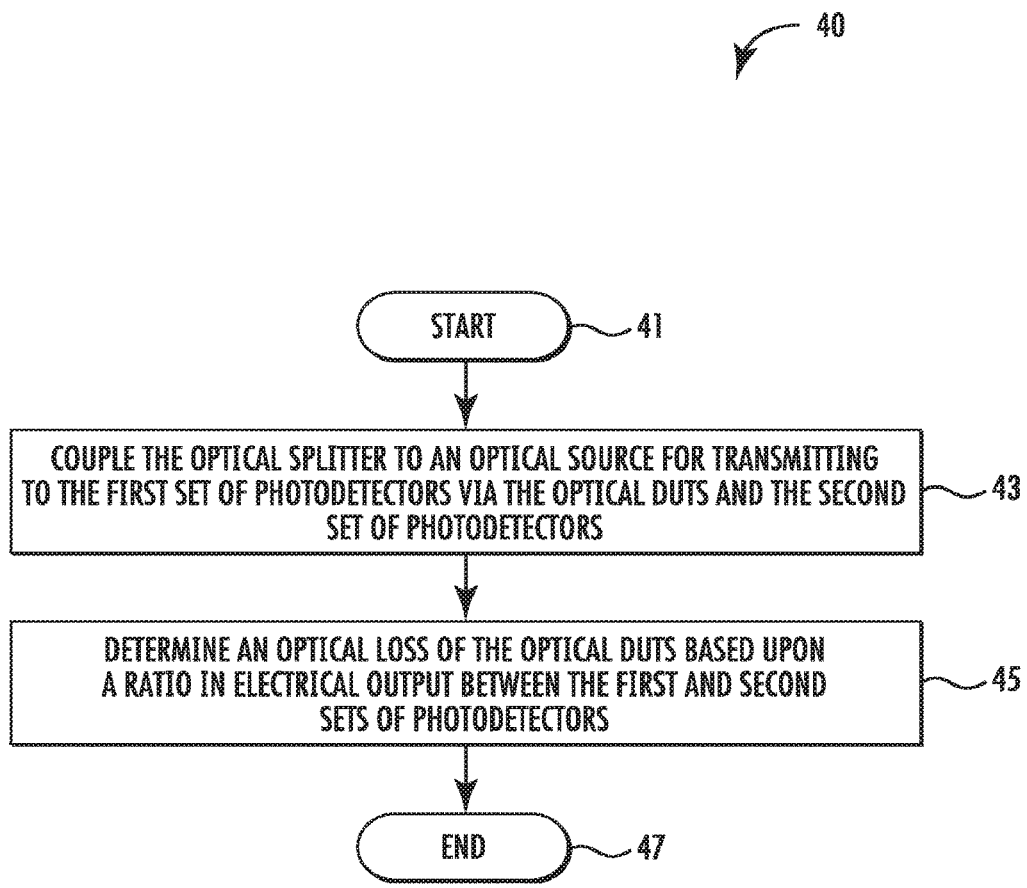
FIG. 9 is a flowchart of a method, according to the present disclosure.

Referring now additionally to FIG. 9 and a flowchart 40 therein, another aspect is directed to a method for testing a semiconductor device (e.g. an individual IC or a semiconductor wafer comprising a plurality of ICs) 32 (Block 41). The semiconductor device 32 comprises at least one reference circuit 20. The at least one reference circuit 20 may comprise a plurality of a plurality of optical DUTs 24a-24n, 25a-25n, 26a-26n, a first set of photodetectors 27a-27n coupled to outputs of the plurality of optical DUTs, at least one optical splitter 23 coupled to inputs of optical DUTs, and a second set of photodetectors 29a-29n coupled to the at least one optical splitter. The method may include coupling the at least one optical splitter 23 to an optical source 21 for transmitting an optical signal to the first set of photodetectors 27a-27n via the plurality of optical DUTs 24a-24n, 25a-25n, 26a-26n and the second set of photodetectors 29a-29n (Block 43). The method may comprise determining an optical loss of the plurality of optical DUTs 24a-24n, 25a-25n, 26a-26n based upon a ratio in electrical output between the first and second sets of photodetectors 27a-27n, 29a-29n. (Blocks 45, 47).

Yet another aspect is directed to a method for making a semiconductor device 32 comprising forming at least one reference circuit 20 carried by a semiconductor wafer 34, and forming the at least one reference circuit. The at least one reference circuit 20 may include a plurality of optical DUTs 24a-24n, 25a-25n, 26a-26n, a first set of photodetectors 27a-27n coupled to outputs of the plurality of optical DUTs, at least one optical splitter 23 coupled to inputs of the plurality of optical DUTs, and a second set of photodetectors 29a-29n coupled to the at least one optical splitter. The at least one optical splitter 23 may be coupled to an optical source 21 and configured to transmit a reference optical signal to the first set of photodetectors 27a-27n via the plurality of optical DUTs 24a-24n, 25a-25n, 26a-26n and the second set of photodetectors 29a-29n.

In the field of manufacturing optical devices, there is a desire to measure optical losses for finished devices for quality control purposes. In typical approaches, determining the optical loss for manufactured optical devices was difficult since individual loss was quite low (e.g. on the order of 0.015 dB per component). To address the issue, some approaches would cascade the optical devices together between an optical input and an optical output, i.e. defining a reference circuit.

The overall loss of the reference circuit was determined and divided by the number of test optical devices to determine average device loss. If the determined loss is outside the acceptable range, the wafer is considered defective and removed from the manufacturing process. A potential issue with this approach is that the optical input and output require precise alignment to avoid unintentional loss due to misalignment. This alignment issue is worsened when an optical fiber array needs to be aligned with multiple outputs (due to the intrinsic misalignment within the array). Since this testing is done at the wafer level before singulation, this laborious effort could grow geometrically if each wafer includes multiple reference circuits. Indeed, this task can be exhaustive when each IC within a wafer includes a reference circuit.

The reference circuit 20 disclosed herein provides an approach to this problem. Firstly, since the output terminals 28a-28n, 31 are electrical, the alignment of the output terminal reading is substantially easier and can use typical electrical probes. Also, there is only one or two optical inputs (i.e. the grating coupler 22), which reduces the amount of alignment effort needed to determine a loss percentage. Indeed, in the embodiments of FIGS. 1-3, there is only one grating coupler 22, 222, 322, which is used for both the reference signal and the loss signal. This also eliminates the need for aligning an optical fiber array. In particular, the loss is governed by the following equation: Loss=$N*I_i/I_o$ in the case of one output terminal 31. A threshold condition at 3σ for example: $N*I_i/I_o$>Loss 3σ (Loss 3σ being the device tolerance versus the technology/platform specifications) can be used to do Optical Wafer Sorting (OWS).

Referring now additionally to FIGS. 4-5, another embodiment of the reference circuit 120 is now described. In this embodiment of the reference circuit 120 those elements already discussed above with respect to FIGS. 1-3 are incremented by 100 and most require no further discussion herein. This embodiment differs from the previous embodiment in that this reference circuit 120 illustratively includes first and second gratings couplers 122a-122b, and first and second optical splitters 123a-123b respectively coupled to the first and second gratings couplers. The first optical splitter 123a is coupled between an output of the first grating coupler 122a and the inputs of the plurality of optical DUTs 124a-124n, 125a-125n, 126a-126n. The second optical splitter 123b is coupled between an output of the second grating coupler 122b and the inputs of the second set of photodetectors 129a-129n. In this embodiment, the first and second optical splitters 123a-123b each comprises a balanced optical splitter, for example.

Figure 6:
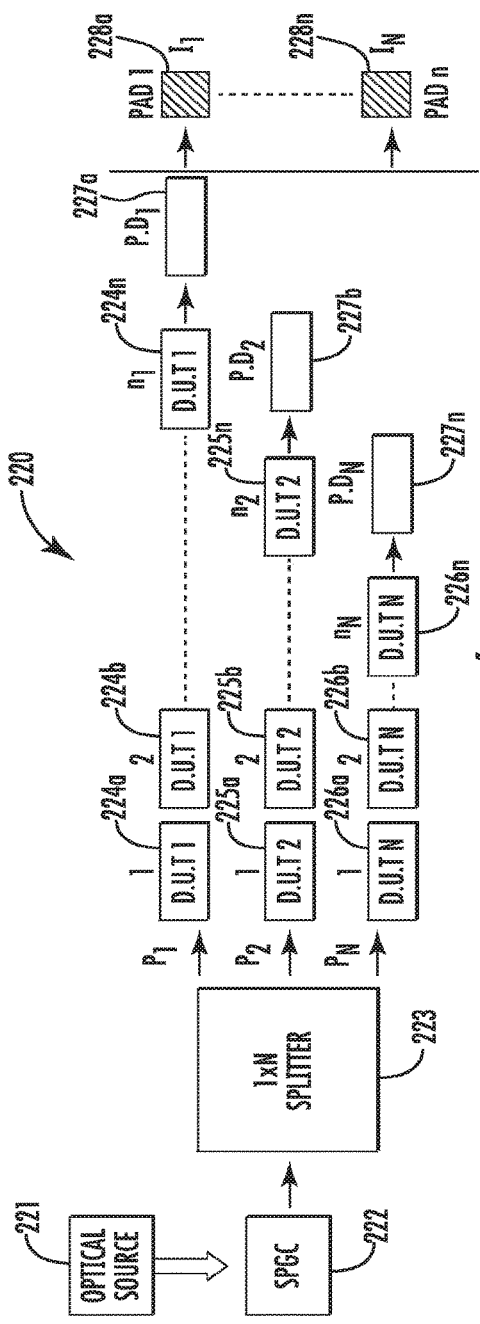
FIGS. 6-7 are schematic diagrams of portions of another embodiment of the reference circuit, according to the present disclosure.
Figure 7:
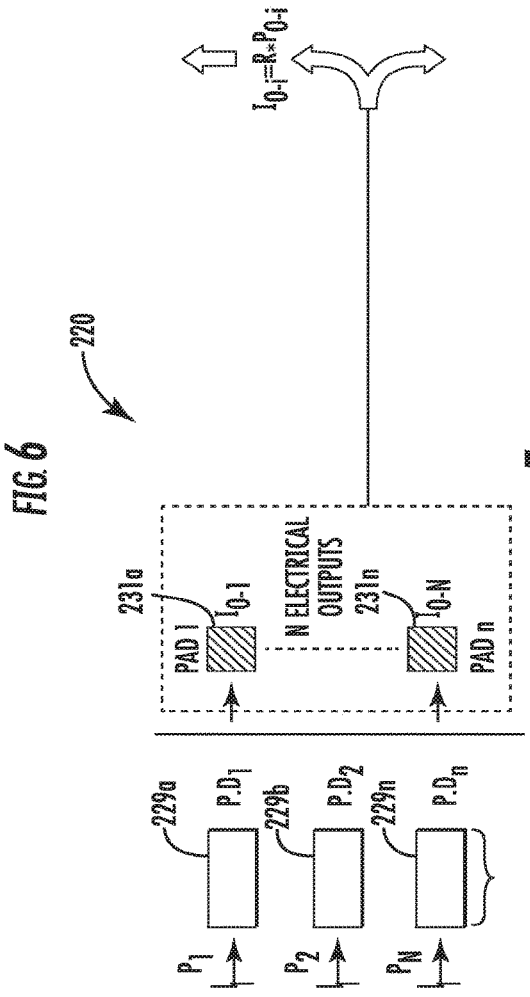

Referring now additionally to FIGS. 6-7, another embodiment of the reference circuit 220 is now described. In this embodiment of the reference circuit 220 those elements already discussed above with respect to FIGS. 1-3 are incremented by 200 and most require no further discussion herein. This embodiment differs from the previous embodiment in that no balanced optical power is required to drive the plurality of optical DUTs 124a-124n, 125a-125n, 126a-126n and the second set of photodetectors 129a-129n. Also, this embodiment differs from the previous embodiment in that this reference circuit 220 illustratively includes a second plurality of output terminals 231a-231n respectively coupled to outputs of the second set of photodetectors 229a-229n. In other words, the summer circuit 30, 130 of the above embodiments is omitted.

Figure 8:
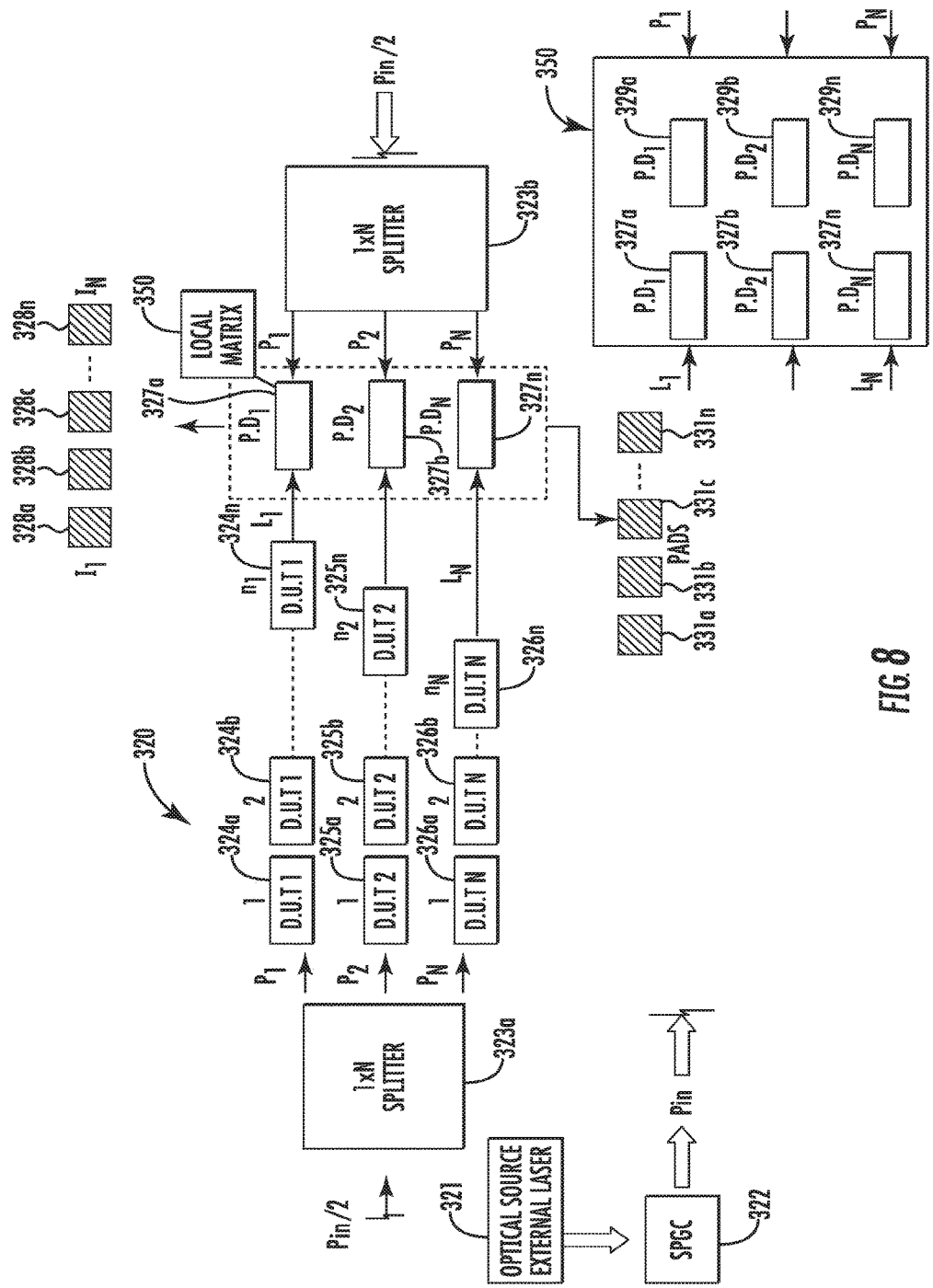
FIG. 8 is a schematic diagram of portions of another embodiment of the reference circuit, according to the present disclosure.

Referring now additionally to FIG. 8, another embodiment of the reference circuit 320 is now described. In this embodiment of the reference circuit 320 those elements already discussed above with respect to FIGS. 1-3 are incremented by 300 and most require no further discussion herein. This embodiment differs from the previous embodiment in that this reference circuit 320 illustratively includes first and second optical splitters 323a-323b coupled downstream from the optical source 321. The output $P_{in}$ of the optical source 321 is split in half $P_{in}/2$ and fed into the inputs of the first and second optical splitters 323a-323b. The 1×2 balanced splitter is similar to the one described herein above.

This embodiment differs from the previous embodiment in that there is two set of photodetectors 327a-327n and 329a-329n (local matrix 350), which are close from layout point of view to solve the hypothesis of matched responsivity for the DUT channel and the reference one. Also, in this embodiment, the first and second optical splitters 323a-323b may either be balanced or unbalanced.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit configured to determine an optical loss, the circuit comprising:
    a plurality of optical devices under tests (DUTs) configured to receive a plurality of reference optical signals;
    a first plurality of photodetectors coupled to outputs of the plurality of optical DUTs; and
    a second plurality of photodetectors having inputs configured to receive the plurality of reference optical signals.

2. The circuit of claim 1, further comprising at least one optical splitter comprising an input coupled to at least one optical source, and a plurality of outputs coupled to inputs of the plurality of optical DUTs, the at least one optical splitter being configured to provide the plurality of reference optical signals to the plurality of optical DUTS and to transmit the plurality of reference optical signals to the first plurality of photodetectors via the plurality of optical DUTs.

3. The circuit of claim 2, the at least one optical splitter being further configured to provide the plurality of reference optical signals to the second plurality of photodetectors.

4. The circuit of claim 2, wherein the at least one optical splitter comprises a single optical splitter.

5. The circuit of claim 2, wherein the at least one optical splitter comprises a first optical splitter and a second optical splitter, the first optical splitter having first outputs coupled to inputs of the plurality of optical DUTs, the second optical splitter having second outputs coupled to inputs of the second plurality of photodetectors.

6. The circuit of claim 5, the first optical splitter comprising a first input coupled to a first output of the at least one optical source, the second optical splitter comprising a second input coupled to a second output of the at least one optical source.

7. The circuit of claim 1, wherein the first plurality of photodetectors comprises photodiodes.

8. The circuit of claim 1, wherein the first plurality of photodetectors and the second plurality of photodetectors have matched optical responsivities.

9. A circuit configured to determine an optical loss, the circuit comprising:
    at least one optical splitter configured to generate a plurality of reference optical signals;
    a plurality of optical devices under tests (DUTs) arranged as N parallel channels of optical DUTs, the N parallel channels of optical DUTs being configured to receive the plurality of reference optical signals from the at least one optical splitter;
    a first plurality of photodetectors, a respective one of the first plurality of photodetectors being coupled to an output of a respective one of the N parallel channels of optical DUTs; and
    a second plurality of photodetectors having inputs configured to receive the plurality of reference optical signals from the at least one optical splitter.

10. The circuit of claim 9, wherein a respective one of the N parallel channels of optical DUTs is configured to receive a respective one of the plurality of reference optical signals.

11. The circuit of claim 9, wherein the plurality of reference optical signals comprises balanced optical signals.

12. The circuit of claim 9, wherein the first plurality of photodetectors are spaced apart from the second plurality of photodetectors.

13. The circuit of claim 9, further comprising a grating coupler coupled to an input of the at least one optical splitter.

14. The circuit of claim 9, further comprising a first plurality of output terminals, a respective one of the first plurality of output terminals being coupled to a respective one of the first plurality of photodetectors.

15. The circuit of claim 9, further comprising a summer circuit configured to receive and sum outputs of the second plurality of photodetectors.

16. The circuit of claim 15, further comprising a second output terminal coupled to an output of the summer circuit.

17. A method, comprising:
    generating, using at least one optical splitter, a plurality of reference optical signals;
    providing the plurality of reference optical signals to a plurality of optical devices under tests (DUTs) arranged as N parallel channels of optical DUTs;
    generating a first plurality of optical output signals at outputs of the N parallel channels of optical DUTs based on the plurality of reference optical signals;
    generating, using a first plurality of photodetectors, a first electrical output signal based on the first plurality of optical output signals;
    generating, using a second plurality of photodetectors, a second electrical output signal based on the plurality of reference optical signals; and
    determining an optical loss of the plurality of optical DUTs based on a comparison between the first electrical output signal and the second electrical output signal.

18. The method of claim 17, wherein the plurality of reference optical signals comprises balanced reference optical signals.

19. The method of claim 17, wherein the first plurality of photodetectors and the second plurality of photodetectors have matched optical responsivities.

20. The method of claim 17, wherein generating the plurality of reference optical signals comprises:
    receiving, by an optical grating, an optical input from an optical source; and
    providing an output of the optical grating to an input of the at least one optical splitter to generate the plurality of reference optical signals.

* * * * *